TUNNEL DIODE AMPLIFIER EMPLOYING ALTERNATING CURRENT BIAS

Filed Nov. 2, 1960 2 Sheets-Sheet 1

INVENTORS
JAMES J. HILL &
MELVIN M. KAUFMAN
BY
Carl V. Olson
ATTORNEY

TUNNEL DIODE AMPLIFIER EMPLOYING ALTERNATING CURRENT BIAS

Filed Nov. 2, 1960

INVENTORS
JAMES J. HILL &
MELVIN M. KAUFMAN
BY Carl V. Olson
ATTORNEY

United States Patent Office 3,143,662
Patented Aug. 4, 1964

3,143,662

TUNNEL DIODE AMPLIFIER EMPLOYING ALTERNATING CURRENT BIAS

James J. Hill, Haddonfield, and Melvin M. Kaufman, Merchantville, N.J., assignors to Radio Corporation of America, a corporation of Delaware Filed Nov. 2, 1960, Ser. No. 66,749
5 Claims. (Cl. 307—88.5)

This invention relates to amplifiers, and more particularly to tunnel diode amplifiers which are sensitive to input signals of small amplitude. While not limited thereto, the invention is useful as an amplifier for sensing information stored in a memory of a high speed electronic data processing apparatus.

It is the general object of this invention to provide an improved tunnel diode amplifier capable of operation at very high speeds in responding reliably to an input signal of very small amplitude.

In one aspect the invention comprises two tunnel diodes connected in series with both a direct current bias and a high frequency alternating current bias applied across the series connected diodes. Means are provided for applying an input signal to the junction between the diodes. The combined peak bias is selected with relation to the characteristics of the diodes so that when one diode is in the high voltage state, the other is forced into the low voltage state, and vice versa. The diodes are further selected to have characteristics relative to each other so that in the absence of an input signal the bias voltages cause one diode to assume the high voltage state, and in the presence of an input signal the bias voltages cause the other diode to assume the high voltage state. In another aspect the invention includes additional means to render the amplifier sensitive to an input signal solely during predetermined intervals.

Figure 1:
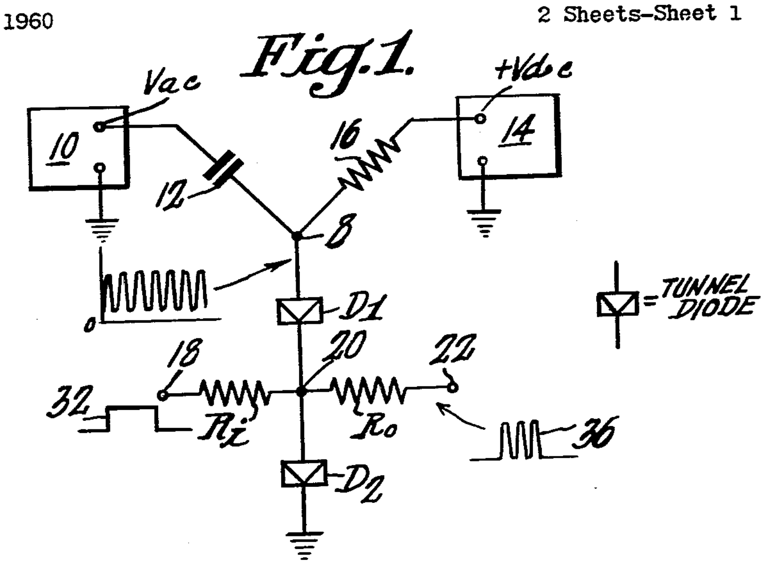
Figure 3:
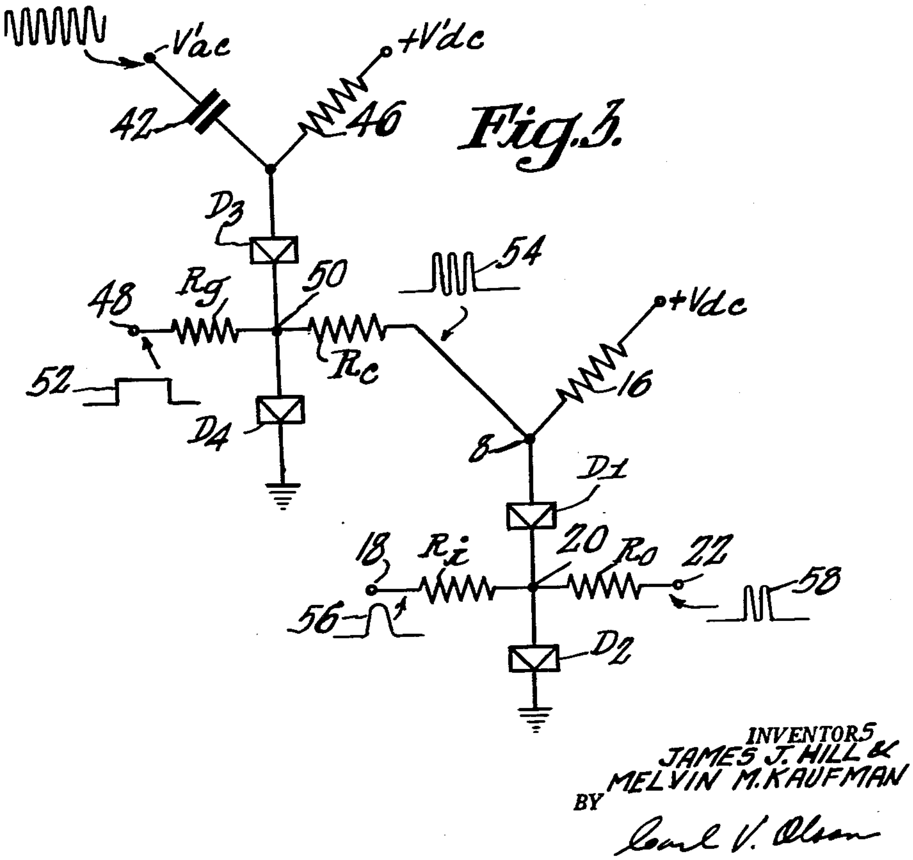

These and other objects and aspects of the invention will be apparent to those skilled in the art from the following more detailed description taken in conjunction with the appended drawings wherein:

FIGURE 1 is a circuit diagram of an amplifier constructed according to the teachings of the invention;

FIGURES 2*a* through 2*e* are charts of the characteristics of the tunnel diodes in the circuit of FIGURE 1 which will be referred to in describing the operation of the circuit; and FIGURE 3 is a circuit diagram of an amplifier like that of FIGURE 1 which is additionally provided with means to render the amplifier sensitive to an input signal solely during predetermined intervals.

The amplifier shown in FIGURE 1 includes two tunnel diodes $D_1$ and $D_2$ connected in series between terminals 8 and ground, with the diodes poled in the same direction. The output of an alternating current bias source 10 is coupled across the series connected diodes by a connection from a $V_{ac}$ terminal through a direct current blocking capacitor 12 to the point 8. The alternating current bias preferably has a frequency in the radio frequency range such that a half-cycle period is of the same order of magnitude as the rise time of the diodes. The output of a direct current bias source 14 is also coupled across the series connected diodes by a connection from a terminal $+V_{dc}$ through a low value resistor 16 to the point 8. Various bias power supply arrangements can be employed, and the configuration illustrated in FIGURE 1 is intended to represent one wherein the bias applied to the point 8 constitutes a direct current having a sinusoidal alternating current superimposed thereon. The direct current bias source 14 looking back from point 8 should preferably be one of low internal impedance so that the source appears to be a substantially constant voltage source.

An input terminal 18 is coupled through an input resistor $R_i$ to the junction 20 between diodes $D_1$ and $D_2$. The junction 20 is coupled through an output resistor $R_o$ to an output terminal 22.

The construction and operation of the amplifier circuit of FIGURE 1 will be described with references to the charts of FIGURE 2 showing the current-voltage characteristic, under different bias and signal conditions, of the lower diode $D_2$ as modified by the effects of input resistor $R_i$ and output resistor $R_o$. The upper diode $D_1$ may be viewed as a load for the lower diode $D_2$, and its characteristic is thus shown reversed on the same axes.

Figures 2A, 2B, 2C, 2D, 2E:
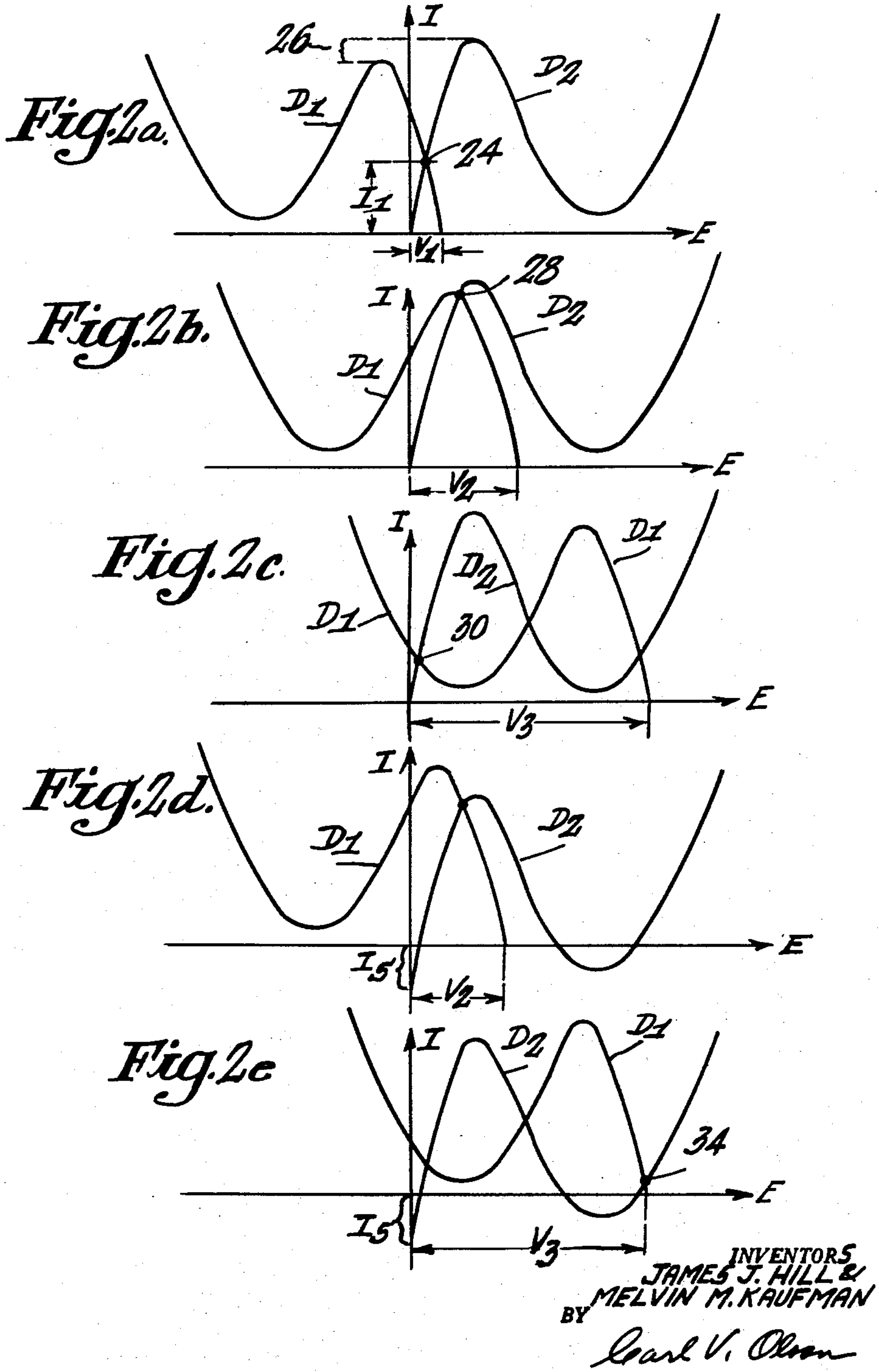

FIGURE 2*a* shows the characteristics of diodes $D_1$ and $D_2$ in a relationship existing when a small instantaneous voltage $V_1$ is applied across the series diodes between point 8 and ground. The intersection 24 of the two curves defines the operating point wherein the voltage $V_1$ is divided between the two diodes and the current $I_1$ flows through both diodes. The operating point 28 is in the low voltage positive resistance region of the characteristic of both diodes.

FIGURE 2*a* also illustrates an important factor in the construction of the circuit of FIGURE 1, namely, that the peak current of the upper diode $D_1$ is less than the peak current of the lower diode $D_2$ by an amount 26. As the voltage across the diodes increases to the value $V_2$ shown in FIGURE 2*b*, the operating point is as represented at 28. It can be seen that, because diode $D_1$ has a lower peak current than diode $D_2$, a further increase in the voltage $V_2$ will cause the negative resistance region of the diode $D_1$ to be encountered before the negative resistance region of the diode $D_2$ is reached. Therefore, as the voltage $V_2$ is increased further, the diode $D_1$ switches to its high voltage state and the diode $D_2$ remains in its low voltage state. This condition is illustrated in FIGURE 2*c* where the large voltage $V_3$ is applied, and the operating point is a point 30 in the high voltage positive resistance region of the characteristic of diode $D_1$ and is a point in the low voltage positive resistance region of the diode $D_2$.

Therefore, FIGURE 2*c* illustrates the fact that, in the absence of an input signal applied to the input terminal 18 in the amplifier of FIGURE 1, the application of full instantaneous bias $V_3$ to the circuit always causes the upper diode $D_1$ to go to its high voltage state, while the lower diode $D_2$ remains in its low voltage state. The instantaneous voltage $V_3$ in FIGURE 2*c* represents the order of magnitude of the combined amplitude of the direct current and alternating current bias voltages. In the construction of the circuit of FIGURE 1, the amplitudes of the bias voltages are selected with relation to the characteristics of the diodes so that when peak bias voltage is applied, one diode ($D_1$) is forced to switch to its high voltage state, and the other diode ($D_2$) is forced to remain in its low voltage state.

The effect of the direct current bias $V_{dc}$ and the superimposed alternating current bias $V_{ac}$ may be viewed as causing the instantaneous bias across the diodes to oscillate between a minimum value $V_1$ as shown in FIGURE 2a and a maximum or peak value $V_3$ as shown in FIGURE 2c. In the absence of an input signal on terminal 18, the lower diode $D_2$ always remains in a low voltage state, and no output signal is delivered to the output terminal 22.

The effect of an input signal will now be considered with references to FIGURES 2d to 2e. A positive input signal 32 applied to input terminal 18 causes a relatively greater current to flow through diode $D_2$ than flows through diode $D_1$. The effect of the presence of an input signal is represented graphically in FIGURE 2d by shifting the characteristic curve of diode $D_2$ downwardly by an amount $I_s$ representing the signal current. With an input signal present, the negative resistance region of the lower diode $D_2$ is encountered first as the voltage $V_2$ increases. Therefore the diode $D_2$ switches to its high voltage state, and the diode $D_1$ remains in its low voltage state to provide the peak bias operating point 34 in FIGURE 2e.

When an input signal 23 is present at the input of the circuit of FIGURE 1, the rapidly fluctuating bias supplied to the diodes from the sources 10 and 14 causes the lower diode $D_2$ to switch between its low and high voltage states. The resulting output signal 36 consists of a burst of oscillations corresponding in frequency to the frequency of the bias source 10. The output signal 36 is suitable for triggering a utilization circuit in the form of a monostable tunnel diode circuit; or the signal may be rectified, if desired, to provide an output pulse.

It is thus seen that, in the absence of an input signal 32, the upper diode $D_1$ switches and no output signal is developed. In the presence of an input signal 32, the lower diode $D_2$ switches and an output signal 36 is generated. A very small input signal 32 is effective to change the unbalance of the two diodes so that the lower diode $D_2$ switches and provides an output signal.

FIGURE 3 shows a small signal amplifier like that of FIGURE 1 but differing therefrom in that the alternating current bias is supplied to the amplifier only during predetermined intervals when an input signal may be present. The circuit of diodes $D_1$ and $D_2$ is the same as the corresponding circuit of FIGURE 1. The alternating current bias source 10, 12 in FIGURE 1 is replaced in FIGURE 3 by a gating circuit including series connected tunnel diodes $D_3$ and $D_4$ which are supplied with an alternating current bias $V'_{ac}$ through capacitor 42, and are supplied with a direct current bias $V'_{dc}$ through resistor 46. A gating signal input terminal 48 is coupled through a resistor $R_g$ to the junction point 50 between the diodes $D_3$ and $D_4$. The point 50 is coupled through a coupling resistor $R_c$ to the terminal 8 of the amplifier.

In the operation of the circuit of FIGURE 3, the biases $V'_{ac}$ and $V'_{dc}$ are applied to the gating diodes $D_3$ and $D_4$ which are selected so that the upper diode $D_3$ switches between its low and high voltage states in synchronism with $V'_{ac}$. Diode $D_4$ remains in its low voltage state and no output appears at junction point 50. However, when an input gate pulse 52 is applied to the gate input terminal 48, the diodes are unbalanced in the other direction, and diode $D_4$ switches between its low voltage and high voltage states in synchronism with $V'_{ac}$. A burst of oscillations 54 occurring during the presence of the gate pulse 52 is thus generated at point 50 and is coupled through resistor $R_c$ to the point 8 of the amplifier including diodes $D_1$ and $D_2$.

The circuit of FIGURE 3 is especially useful in applications where the time of occurrence of the signal input pulse 56 can vary over a limited time range, and where it is desired to make the amplifier sensitive to the input signal solely during this time so that it will not amplify disturbances occurring at other times. The amplifier including diodes $D_1$ and $D_2$ is supplied with alternating current bias 54 (controlled by gate pulse 52) solely during the limited time range when an input signal 56 can be expected. The input signal 56 results in an output signal 58 in the manner that has been explained in connection with the amplifier circuit of FIGURE 1.

In the construction of the circuits of FIGURES 1 and 3, the frequency of the alternating current bias is selected to be sufficiently high with relation to the width of the input signal pulse so that at least one cycle of the bias occurs during the input pulse. The frequency of the alternating current bias is also selected to be such that a half cycle of the bias wave has a time period of the same order of magnitude as the rise time of the tunnel diodes. The rise time of a tunnel diode is the time required following the application of an input pulse for the diode to switch from its low voltage state to its high voltage state.

The tunnel diodes $D_1$ and $D_2$ are selected so that diode $D_1$ has a lower effective peak current than diode $D_2$, as is illustrated in the chart of FIGURE 2a. The characteristic shown for diode $D_2$ is the actual characteristic of the diode $D_2$ alone as modified by the presence of input resistor $R_i$ and output resistor $R_o$. The desired characteristic shown for diode $D_1$ may be obtained by selecting a diode having the desired peak current, or may be obtained by modifying the characteristic of a given available diode by connecting a resistor in shunt with the diode and trimming its value until the desired effective peak current is obtained.

The circuits of FIGURES 1 and 3 are most sensitive to very small input signals when the effective peak current of diode $D_1$ is only very slightly less than the effective peak current of diode $D_2$. However, if the difference in peak currents is made too small, the circuit will undesirably respond to unavoidable noise impulses present at the input. Therefore, the designer must chose a difference in peak currents giving him a suitable compromise between sensitivity to small signals and reliability of operation.

What is claimed is:

1. An amplifier comprising two tunnel diodes connected in series, means to apply a direct current bias across said series connected diodes, means to apply an alternating current bias across said series connected diodes, means to apply an input signal to the junction between said diodes, and means to derive an output signal from the junction between said diodes, said diodes being selected to have characteristics such that when instantaneous peak bias voltage is applied, one of the diodes must be in its high voltage state and the other must be in its low voltage state, said diodes being further selected to have different characteristics so that in the absence of an input signal of one polarity the peak bias voltage causes a particular one of the diodes to assume the high voltage state, and in the presence of said input signal the peak bias voltage causes the other one of the diodes to assume the high voltage state.

2. An amplifier as defined in claim 1 wherein said alternating current bias has a frequency such that a half period is of the same order of magnitude as the rist time of the diodes.

3. An amplifier as defined in claim 1 wherein said alternating current bias has a frequency such that one cycle has a duration less than the duration of the input signal.

4. An amplifier as defined in claim 1 wherein said alternating current bias is in the form of periodic bursts of radio frequency energy.

5. An amplifier as defined in claim 4 wherein said bursts are supplied by a gated circuit comprising two tunnel diodes connected in series, means to apply both direct current bias and alternating current bias across said series connected diodes, means to apply a gating pulse wave to the junction between said diodes, and means to couple bursts from the junction between said diodes in the gated circuit to said amplifier circuit.

(References on following page)

References Cited in the file of this patent

UNITED STATES PATENTS

| | | |
|---|---|---|
| 2,966,599 | Haas | Dec. 27, 1960 |
| 2,986,724 | Jaeger | May 30, 1961 |
| 2,997,604 | Shockley | Aug. 22, 1961 |
| 2,997,659 | Abbott et al. | Aug. 22, 1961 |
| 3,069,564 | DeLange | Dec. 18, 1962 |
| 3,075,088 | Li | Jan. 22, 1963 |
| 3,089,039 | Abraham | May 7, 1963 |
| 3,105,957 | Li | Oct. 1, 1963 |

FOREIGN PATENTS

| | | |
|---|---|---|
| 778,883 | Great Britain | July 10, 1957 |

OTHER REFERENCES

Unique Properties of the Four-Layer Diode," by Wm. Shockley, Electronic Industries & Tele-Tech, August 1957, pp. 58–60, 161–165.

"Tunnel-Diode Computers," by Rajchman, 1959, Proceedings of the Eastern Joint Computer Conference, Dec. 3, 1959.